US007649768B2

(12) United States Patent
Hirose

(10) Patent No.: US 7,649,768 B2
(45) Date of Patent: Jan. 19, 2010

(54) RESISTANCE MEMORY ELEMENT

(75) Inventor: Sakyo Hirose, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/352,689

(22) Filed: Jan. 13, 2009

(65) Prior Publication Data

US 2009/0109730 A1 Apr. 30, 2009

Related U.S. Application Data

(63) Continuation of application No. PCT/JP2007/055989, filed on Mar. 23, 2007.

(30) Foreign Application Priority Data

Jul. 14, 2006 (JP) ............................ 2006-193556

(51) Int. Cl.
*G11C 11/00* (2006.01)

(52) U.S. Cl. ........................ 365/158; 365/171; 365/173

(58) Field of Classification Search ................. 365/158, 365/171, 173
See application file for complete search history.

(56) References Cited

U.S. PATENT DOCUMENTS

| | | | | |
|---|---|---|---|---|
| 5,075,818 | A | 12/1991 | Ueno et al. | |
| 6,992,369 | B2 * | 1/2006 | Kostylev et al. | 257/537 |
| 7,061,790 | B2 | 6/2006 | Morimoto et al. | |
| 2004/0245547 | A1 * | 12/2004 | Stipe | 257/200 |
| 2005/0145910 | A1 | 7/2005 | Tamai et al. | |
| 2005/0260839 | A1 | 11/2005 | Allenspach et al. | |

FOREIGN PATENT DOCUMENTS

| | | | |
|---|---|---|---|
| JP | 05-036931 | A2 | 2/1993 |
| JP | 2000-236100 | A | 8/2000 |
| JP | 2001-210817 | A | 8/2001 |
| JP | 2006-324447 | A | 11/2006 |

OTHER PUBLICATIONS

Official Communication issued in International Patent Application No. PCT/JP2007/055989, mailed on Apr. 17, 2007.

Fujii et al.; "Hysteretic Current-Voltage Characteristics and Resistance Switching at an Epitaxial Oxide Schottky Junction SrRuO3/SrTi0.99Nb0.01O3", Applied Physics Letters 86, Dec. 23, 2004.

* cited by examiner

*Primary Examiner*—Son Dinh
(74) *Attorney, Agent, or Firm*—Keating & Bennett, LLP

(57) ABSTRACT

A resistance memory element includes an elementary body and opposing electrodes separated by at least a portion of the elementary body. The elementary body is preferably made of a strontium titanate-based semiconductor ceramic expressed by the formula: $(Sr_{1-x}A_x)_v(Ti_{1-y}B_y)_wO_3$ (where A represents at least one element selected from the group consisting of Y and rare earth elements, and B represents at least one of Nb and Ta), and satisfies the relationships $0.001 \leqq x+y \leqq 0.02$ (where $0 \leqq x \leqq 0.02$ and $0 \leqq y \leqq 0.02$) and $0.87 \leqq v/W \leqq 1.030$. This semiconductor ceramic changes the switching voltage depending on, for example, the number of grain boundaries in the portion between the opposing electrodes.

7 Claims, 2 Drawing Sheets

RESISTANCE MEMORY ELEMENT

BACKGROUND OF THE INVENTION

1. Field of the Invention

The present invention relates to resistance memory elements, and particularly, to a resistance memory element including an elementary body made of a polycrystalline semiconductor ceramic.

2. Description of the Related Art

A resistance memory element includes an elementary body that can memorize resistance. This elementary body originally has, for example, a relatively high resistance. However, when at least a predetermined voltage is applied to the elementary body, the resistance is reduced and a low resistance state is maintained or memorized even after the applied voltage is removed. In contrast, when at least the predetermined voltage is applied in the opposite direction to the elementary body in a low resistance state, the resistance is increased and a high resistance state is maintained or memorized even after the voltage is removed.

Such a resistance memory element can switch between a high resistance state and a low resistance state by applying a voltage equal to or greater than a threshold in a positive direction or the opposite direction, and thus, can change and memorize the resistance. Such resistive switching enables the resistance memory element to function not only as a memory element, but also as a switching element.

A known resistance memory element is described in, for example, T. Fujii et al., "Hysteretic Current-Voltage Characteristics and Resistance Switching At An Epitaxial Oxide Schottky Junction $SrRuO_3/SrTi_{0.99}Nb_{0.01}O_3$", APPLIED PHYSICS LETTERS 86, 012107 (2005). In a resistance memory element described in this published article, an interface between different types of material, more specifically, the bonded interface between a monocrystalline substrate and a $SrRuO_3$ thin film (monocrystalline thin film), is capable of memorizing resistances. This resistance memory element has a switching voltage not greater than about 3 V, and accordingly, switches at a relatively low voltage. The switching voltage refers to a voltage at which the resistance state is changed.

Many of the circuits in which a resistance memory element may be used are operated at a rated voltage of greater than about 3 V. When a resistance memory element as described in the above published article is used as a switching element with a relatively high driving voltage, the switching voltage must be greater than the rated voltage.

However, since the switching voltage of the resistance memory element of the above published article is not greater than about 3 V, the element may switch at the driving voltage. Thus, this element cannot be used as a switching element with a relatively high driving voltage.

If a switching element that switches at a voltage of, for example, at least about 30 V is produced, another resistor must be provided in series. In this instance, the switching voltage can be set to a relatively high voltage, but the power consumption is increased due to the additional resistor. In addition, the resistor disadvantageously reduces the variation of resistances switched.

Varistors are also relevant to the present invention. For example, Japanese Patent No. 2727626 discloses a multilayer varistor including a $SrTiO_3$ elementary body including various elements and internal electrodes made primarily of Pd in the elementary body. In order to produce such a varistor, an element that functions as an acceptor is actively diffused or added and re-oxidation is performed to form a grain boundary barrier after a reduction treatment for forming semiconductor. When at least a predetermined voltage is applied to the varistor, the varistor changes into a low resistance state, but the state is not maintained or memorized and is returned to the initial state after the applied voltage is removed. Thus, the varistor is not a resistance memory element.

SUMMARY OF THE INVENTION

To overcome the problems described above, preferred embodiments of the present invention provide a resistance memory element having a relatively high switching voltage, whose resistance can be changed at a relatively high rate.

Preferred embodiments of the present invention are directed to a resistance memory element including an elementary body and at least a pair of opposing electrodes separated by at least a portion of the elementary body. When a switching voltage is applied between the pair of electrodes in a first direction, the resistance of the portion of the elementary body disposed between the pair of electrodes is reduced and the elementary body maintains a low resistance state even after the switching voltage in the first direction is removed. When a switching voltage is applied between the pair of electrodes in a second direction opposite to the first direction, the resistance of the portion of the elementary body disposed between the pair of electrodes is increased and the elementary body maintains a high resistance state even after the switching voltage in the second direction is removed. The elementary body is preferably made of a strontium titanate-based semiconductor ceramic, for example.

Preferably, the strontium titanate-based semiconductor ceramic is expressed by the formula: $(Sr_{1-x}A_x)_v(Ti_{1-y}B_y)_wO_3$ (where A represents at least one element selected from the group consisting of Y and rare earth elements, and B represents at least one of Nb and Ta), and satisfies the relationships $0.001 \leqq x+y \leqq 0.02$ (where $0 \leqq x \leqq 0.02$ and $0 \leqq y \leqq 0.02$) and $0.87 \leqq v/w \leqq 1.030$.

More preferably, the strontium titanate-based semiconductor ceramic satisfies the relationship $0.005 \leqq x+y \leqq 0.01$.

More preferably, the strontium titanate-based semiconductor ceramic satisfies the relationship $0.950 \leqq v/w \leqq 1.010$.

Preferably, the average number of grain boundaries in the portion of the elementary body disposed between the pair of electrodes is in the range of about 0.5 to about 44.5, for example.

Preferably, the electrodes are formed by being fired together with the elementary body.

Preferably, the electrodes include at least one metal selected from the group consisting of Pd, Pt, Ag—Pd, Au, Ru, and Ir, for example.

According to preferred embodiments of the present invention, switching between a low resistance state and a high resistance state can be achieved with a high switching voltage of, for example, at least about 10 V, and the resistance can be changed at a high rate of, for example, at least about 5,000% even with a relatively high driving voltage. Also, the switching voltage can be controlled by controlling the number of grain boundaries between the pair of electrodes, that is, the distance between the electrodes or the thickness of the elementary body.

For example, when the strontium titanate-based semiconductor ceramic is expressed by the above formula and satisfies the relationships $0.001 \leqq x+y \leqq 0.02$ (where $0 \leqq x \leqq 0.02$ and $0 \leqq y \leqq 0.02$) and $0.87 \leqq v/w \leqq 1.030$, and further satisfies a more preferable relationship $0.005 \leqq x+y \leqq 0.01$ or $0.950 \leqq v/w \leqq 1.010$, or when the average number of grain boundaries between the pair of electrodes is in the range of about 0.5 to about 44.5, the resistance can be changed at a higher rate of, for example, at least about 10,000%.

If the electrodes are formed by being fired together with the elementary body, the interfaces between the electrodes and the elementary body are strengthened to increase the withstand voltage. Consequently, the switching voltage can be increased without problems.

If the electrodes include at least one metal selected from the group consisting of Pd, Pt, Ag—Pd, Au, Ru, and Ir, for example, a Schottky junction can be produced between the electrodes and the elementary body.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
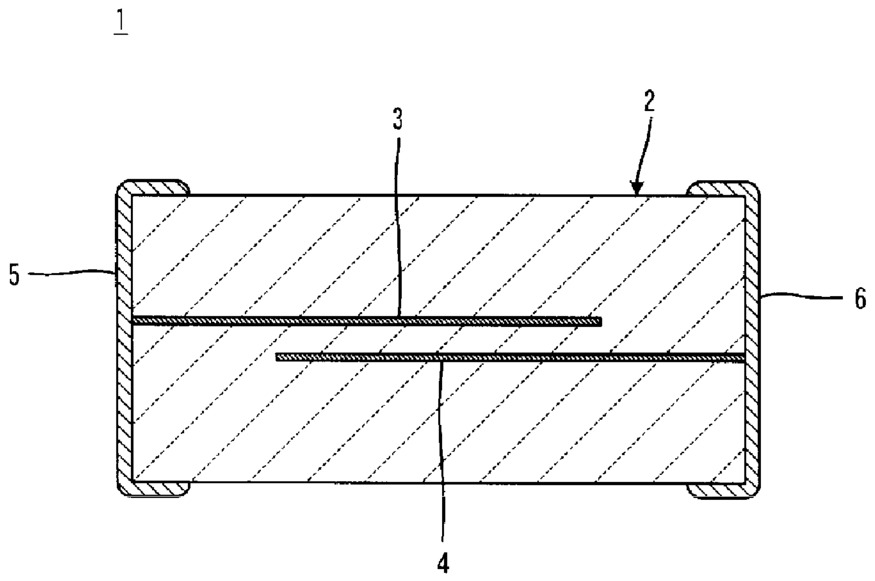
FIG. 1 is a sectional view of a resistance storage element according to a preferred embodiment of the present invention.

FIG. 1 is a sectional view of a resistance memory element 1 according to a preferred embodiment of the present invention.

The resistance memory element 1 includes an elementary body 2 made of a strontium titanate-based semiconductor ceramic. The strontium titanate-based semiconductor ceramic of the elementary body 2 is preferably expressed by the formula $(Sr_{1-x}A_x)_v(Ti_{1-y}B_y)_wO_3$. In this formula, A represents at least one element selected from the group consisting of Y and rare earth elements, and is preferably at least one element selected from the group consisting of Y, La, Ce, Pr, Nd, Sm, Eu, Gd, Tb, Dy, and Ho, for example. Also, B represents at least one of Nb and Ta, for example. In addition, the formula satisfies the following relationships: $0.001 \leqq x+y \leqq 0.02$ (where $0 \leqq x \leqq 0.02$ and $0 \leqq y \leqq 0.02$); and $0.87 \leqq v/w \leqq 1.030$.

The resistance memory element 1 also includes at least a pair of opposing electrodes 3 and 4 that oppose each other with at least a portion of the elementary body 2 therebetween. In the present preferred embodiment, the elementary body 2 preferably has a multilayer structure. The opposing electrodes 3 and 4 are disposed in the elementary body 2 with at least a portion of the elementary body 2 disposed therebetween, and are fired in that state simultaneously with firing the elementary body 2. By firing the opposing electrodes 3 and 4 and the elementary body 2 at the same time at a relatively high temperature, their interfaces can be strengthened to increase the withstanding voltage of the resistance memory element 1.

Preferably, the opposing electrodes 3 and 4 include at least one metal selected from the group consisting of Pd, Pt, Ag—Pd, Au, Ru, and Ir, for example. The opposing electrodes 3 and 4 made of these metals can produce Schottky junctions between the electrodes and elementary body 2.

The resistance memory element 1 further includes terminal electrodes 5 and 6. The terminal electrodes 5 and 6 are respectively provided on both ends of the elementary body 2, and are electrically connected to the opposing electrodes 3 and 4, respectively. The terminal electrodes 5 and 6 are formed by, for example, burning an electroconductive paste including silver on the elementary body 2.

When a switching voltage is applied between the opposing electrodes 3 and 4 through the terminal electrodes 5 and 6 in a first direction, the resistance of the portion of the elementary body 2 between the opposing electrodes 3 and 4 is reduced, and a low resistance state of the elementary body 2 is maintained even after the switching voltage in the first direction is removed. On the other hand, when a switching voltage is applied to the opposing electrodes 3 and 4 in a second direction opposite to the first direction, the resistance of the portion of the elementary body 2 between the opposing electrodes 3 and 4 is reduced, and a high resistance state is maintained even after the switching voltage in the second direction is removed. The resistance memory element 1 according to preferred embodiments of the present invention can operate stably and properly and enable the resistance to change at a high rate of, for example, at least about 5,000%, even if the switching voltage is increased to, for example, at least about 10 V and, accordingly, the resistance memory element 1 is suitable for use at relatively high driving voltages.

Furthermore, the strontium titanate-based semiconductor ceramic of the elementary body 2 can change its resistance at a higher rate of, for example, at least about 10,000% when the above formula satisfies the more preferable relationships $0.005 \leqq x+y \leqq 0.01$ or $0.950 \leqq v/w \leqq 1.010$.

The strontium titanate-based semiconductor ceramic of the elementary body 2 changes its switching voltage depending on the number of grain boundaries present in the portion disposed between the opposing electrodes 3 and 4. Thus, by controlling the number of grain boundaries present in the portion disposed between the opposing electrodes 3 and 4, that is, by controlling the distance between the opposing electrodes 3 and 4, the switching voltage can be controlled. Furthermore, by selecting the average number of grain boundaries present in the portion disposed between the opposing electrodes 3 and 4 in the range of about 0.5 to about 44.5, for example, the resistance can be changed at a high rate of, for example, at least about 10,000%.

The mechanism of the resistance memory element 1 enable such characteristics is not fully understood. It is generally considered that resistance switching occurs at the interface between a semiconductor and a metal, and that the semiconductor causes changes in resistance at the interface. In preferred embodiments of the present invention, the elementary body 2 has a low resistance because it is made of a polycrystalline strontium titanate-based semiconductor ceramic, but the grain boundaries have high resistances. Consequently, the voltage applied to the electrodes 3 and 4 at which resistance switching occurs is dispersed in the interfaces with the electrodes and grain boundaries to reduce the effective voltage. Thus, a switching voltage greater than that of the resistance memory element described in the above published article can be applied.

The reason why the grain boundaries in the polycrystalline strontium titanate-based semiconductor ceramic have high resistances is probably not only that the conduction electrons are dispersed at the grain boundaries to reduce the mobility, but also that shallow grain boundary levels are produced and function as electron traps to provide a low grain boundary barrier.

If it is assumed that the dispersion of conduction electrons at grain boundaries increases the resistance, the structure is such that a resistor is connected in series to the resistance memory element described in the above published article and the resistance variation is expressed by the following equation:

Resistance variation={(series resistance component+resistance of element in high resistance state)−(series resistance component+resistance of element in low resistance state)}/(series resistance component+resistance of element in low resistance state).

In the resistance memory element of the present preferred embodiment, if only the resistances at the electrodes are varied to cause resistance switching, the resistance of the element in the above equation corresponds to the resistance at grain boundaries, and the series resistance component corresponds to ceramic. Since the ceramic itself has a relatively high resistance, the resistance variation should be reduced. Assuming that the series resistance component is about 1 MΩ and is constant, even if the resistance of an element is varied, for example, between about 1Ω in a low resistance state and about 1 MΩ in a high resistance state, the resistance is varied only by about two times, for example, between about 1 MΩ+1Ω in a low resistance state and about 1 MΩ+1 MΩ in a high resistance state because of the presence of the series resistance component. This suggests that the reason why the resistance of the resistance memory element 1 according to preferred embodiments of the present invention is high is not solely due to the fact that conduction electrons are dispersed at the grain boundaries to reduce the mobility.

Thus, the resistance memory element 1 according to preferred embodiments of the present invention can switch its resistance state at a relatively high voltage, and, in addition, the resistance can be varied at a higher rate than that of the element described in the above published article. Low barriers produced at the grain boundaries may greatly contribute to such high resistance variation. Thus, by applying a switching voltage, the height of the barriers at the grain boundaries is varied, and thus, the resistance may be varied at a high rate. If it is assumed that resistance switching is caused only by increasing the grain boundary resistance to reduce the resistance at the interfaces with the electrodes 3 and 4, as described above, then the cause of the high resistance variation cannot be explained.

The resistance memory element 1 according to preferred embodiments of the present invention requires a relatively high switching voltage, as described above. Accordingly, a high voltage is applied to the interfaces between the ceramic and the electrodes 3 and 4 and to the ceramic itself. Thus, the interfaces with the electrodes 3 and 4 and the ceramic require a relatively high withstand voltage. The withstand voltage of the ceramic can be increased by increasing the number of grain boundaries in the portion between the opposing electrodes 3 and 4. The withstand voltage of the interfaces with the electrodes 3 and 4 can be increased by firing the opposing electrodes 3 and 4 together with the elementary body 2 at a relatively high temperature to strengthen the interfaces, as described above.

The resistance switching characteristics of the resistance memory element 1 according to preferred embodiments of the present invention will now be described in detail.

Figure 2:
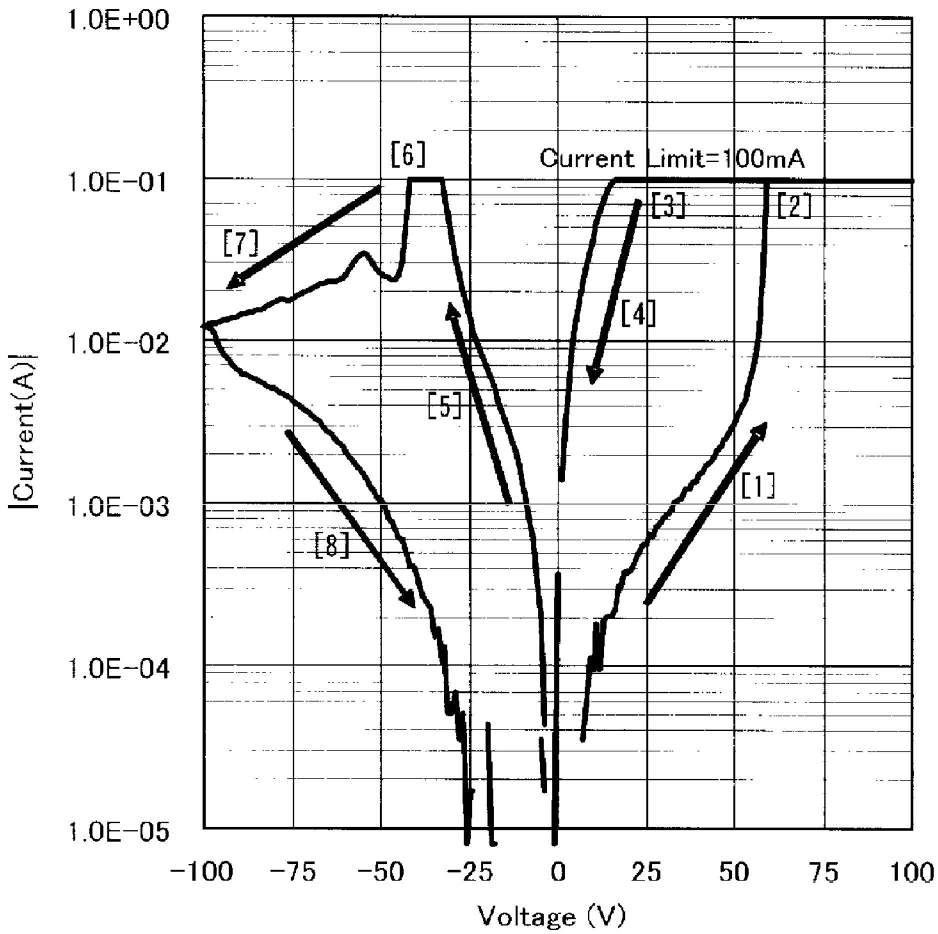
FIG. 2 is a graph of typical current-voltage characteristics of a resistance memory element according to a preferred embodiment of the present invention.

FIG. 2 shows typical current-voltage characteristics (I-V characteristics) of the resistance memory element 1. The resistance memory element 1 having the I-V characteristics shown in FIG. 2 includes an elementary body made of a strontium titanate-based semiconductor ceramic having a composition expressed by $Sr_{0.992}La_{0.008}TiO_3$, corresponding to the composition of Sample 8, which satisfies preferred ranges of various preferred embodiments of the present invention in the experiments described below. In order to obtain the I-V characteristics shown in FIG. 2, voltage pulses having a pulse width of about 0.1 s are applied in increment of about 1 V, and the flowing current is measured.

Referring to FIG. 2, when voltages are applied from about 0 V to about 100 V (state [1]), the current reaches about 100 mA (current limit) at a voltage of about 60 V (state [2]). When the voltage is reduced from about 100 V to about 0 V, the current is reduced to less than about 100 mA at a voltage of about 20 V (state [3]), and the element is changed from a high resistance state to a low resistance state without drawing the same I-V curves between the increase and reduction in voltage (state [4]).

When voltages are subsequently applied from about 0 V to about −100 V (state [5]), the current reaches the current limit at about −30 V, and then the current starts decreasing at about −40 V (state [6]) and is gradually reduced until a voltage of about −100 V (in other words, the resistance is increased) (state [7]). When voltages are then applied from about −100 V to about 0 V, the current is reduced with a high resistance state maintained without drawing the same I-V curves between the increase and reduction in voltage, as above (state [8]).

As described above, when a voltage is applied in a positive direction, the ceramic switches from a high resistance state to a low resistance state. On the other hand, when a voltage is applied in a negative direction, the ceramic switches from a low resistance state to a high resistance state. This resistance switching phenomenon is performed repeatedly in the same manner.

Figure 3:
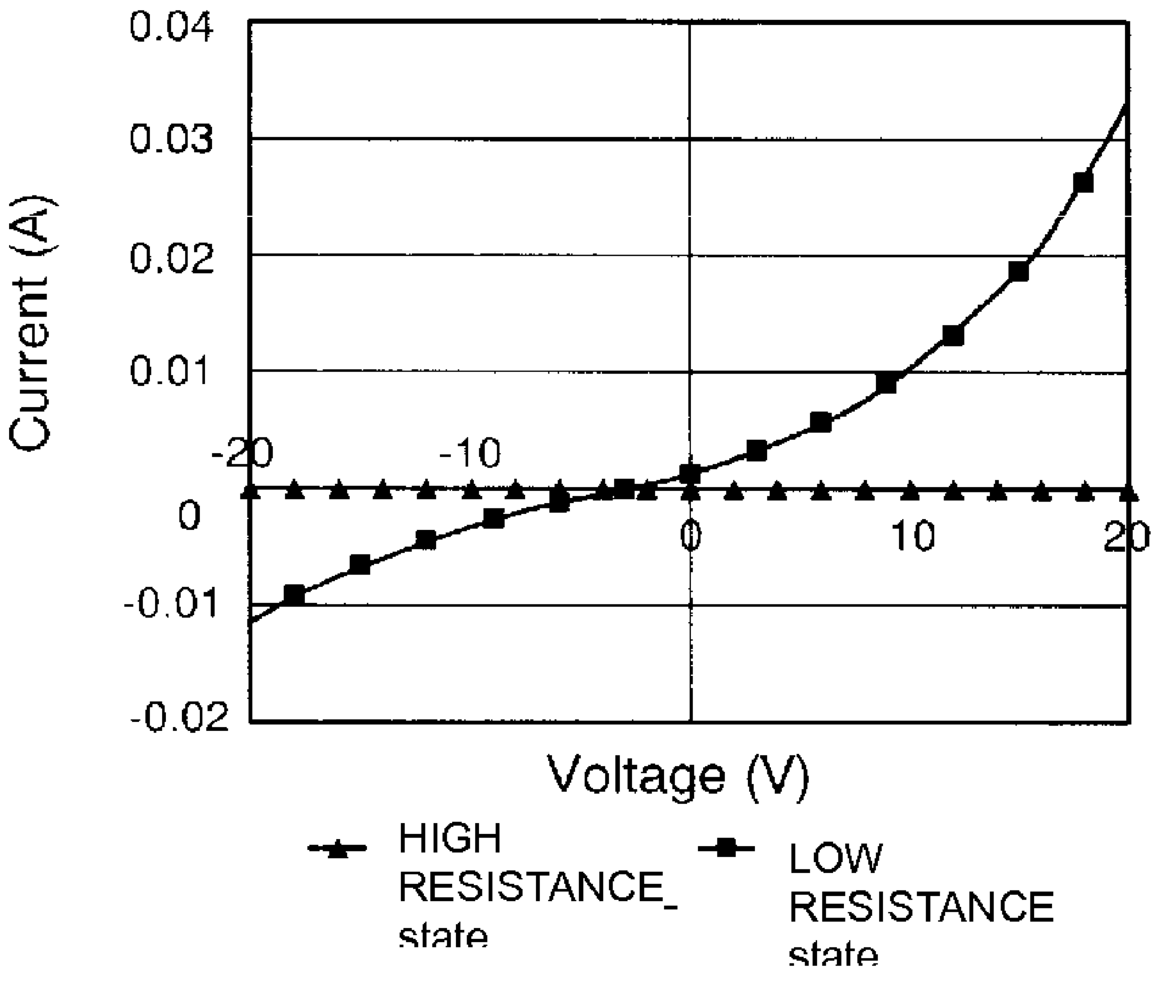
FIG. 3 is a graph of current-voltage characteristics of a resistance storage element according to a preferred embodiment of the present invention, measured in a range of voltages at which resistance switching does not occur, after switching between a high resistance state and a low resistance state.

FIG. 3 shows I-V characteristics measured in the range of about −20 V to about 20 V, in which resistance switching does not occur, after switching between a high resistance state and a low resistance state. As shown in FIG. 3, the high resistance state and the low resistance state are each maintained even after resistance switching. This suggests not only that the resistance is switched, but also that the memory effect of maintaining the resistance state is produced. It was shown that the I-V characteristics shown in FIG. 3 did not change about 24 hours after switching between a high resistance state and a low resistance state.

As shown in FIG. 2, the resistance memory element 1 according to preferred embodiments of the present invention has a switching voltage of several tens of volts. In contrast, the resistance memory element of the above published article shows a resistance memory element having a switching voltage of about 5 V or less. The switching voltage according to preferred embodiments of the present invention, that is, several tens of volts, is significantly greater than that of the resistance memory element of the above published article.

The pulse width dependence of the resistance of the resistance memory element 1 having the I-V characteristics shown in FIG. 2 was examined by applying a voltage of about 50 V to the element 1 while the pulse width is varied to, for example, about 1 ms, about 10 ms, and about 100 ms. As a result, it was shown that the resistance is not varied even when a pulsed voltage with a pulse width of, for example, about 1 ms or about 10 ms is applied, and that the resistance is not varied until a pulsed voltage with a pulse width of about 100 ms is applied. On the other hand, when a voltage of about 5 V was applied to the resistance memory element of the above published article, the element switched to a high resistance state (the current is reduced) at a pulse width of about 1 ms.

When a voltage of about 5 V with a pulse width of about 10 ms was applied, the resistance of the element was further increased.

Accordingly, in order to switch the resistance states in the resistance memory element 1, at least a predetermined voltage must be applied, and in addition, the voltage must have a greater pulse width than the voltage applied to the resistance memory element of the above published article.

Although in the resistance memory element 1 shown in FIG. 1, the opposing electrodes 3 and 4 are preferably disposed in the middle of the elementary body 2 in the thickness direction, the opposing electrodes 3 and 4 may be displaced toward either end in the thickness direction. In an extreme case, one of the opposing electrodes 3 and 4 may be disposed on the external surface of the elementary body 2. Alternatively, both of the opposing electrodes 3 and 4 may be disposed with a predetermined distance therebetween on the external surface of the elementary body 2 such that the end of one opposing electrode 3 or 4 is opposed to the end of the other opposing electrode. In addition, the opposing electrodes 3 and 4 may be disposed at substantially the same plane within the elementary body 2 such that the end of one opposing electrode 3 or 4 is opposed to the end of the other opposing electrode.

The reason that the opposing electrodes 3 and 4 are disposed within the elementary body 2 such that a small portion of the elementary body 2 is disposed between the electrodes 3 and 4 is that such an arrangement provides at least a predetermined mechanical strength to the elementary body 2 while the distance is reduced between the opposing electrodes 3 and 4. If the mechanical strength of the elementary body 2 is not important, then the opposing electrodes may be disposed on a main surface of a thin elementary body.

In addition, while the opposing electrodes 3 and 4 are preferably used not only to apply a switching voltage, but also to measure the current (for measuring the resistance), the opposing electrodes 3 and 4 may be used only to apply a voltage and other electrodes may be provided to measure the current. In this instance, first, second, and third electrodes may preferably be arranged in that order so as to oppose each other. The first and second electrodes are preferably used to measure the current, and the first and third electrodes are preferably used to apply a voltage, using the first electrode as a common electrode, or the first and second electrodes may be used to apply a voltage and the first and third electrodes may be used to measure the current.

In order to confirm that various preferred embodiments of the present invention produce the above-described advantages, and in order to determine the preferred ranges for preferred embodiments of the present invention that produce the advantages, experiments were performed as described below.

Experiment 1

Powder starting materials were prepared for the strontium titanate-base semiconductor ceramic of the elementary body, including strontium carbonate ($SrCO_3$) and titanium oxide ($TiO_2$); and donors: lanthanum oxide ($La_2O_3$), neodymium oxide ($Nd_2O_3$), samarium oxide ($Sm_2O_3$), gadolinium oxide ($Gd_2O_3$), dysprosium oxide ($Dy_2O_3$), holmium oxide ($Ho_2O_3$), or yttrium oxide ($Y_2O_3$) and niobium oxide ($Nb_2O_5$) or tantalum oxide ($Ta_2O_5$).

These starting materials were weighed so that the compositions shown in Tables 1 to 5 were produced after firing. Then, a dispersant and water were added to the weighed materials, and the materials were pulverized and mixed together with PSZ balls having a diameter of about 2 mm for about 24 hours in a wet process. After pulverization, the resulting slurry was dried and calcined at about 1200° C. for about 4 hours in the air. A dispersant and pure water were added to the calcined powder, and the powder was pulverized with PSZ balls having a diameter of about 5 mm for about 24 hours. Then, an acrylic binder, a plasticizer, an antifoaming agent, and other additives were added to the powder. The powder was mixed again for about 12 hours to yield a green sheet slurry.

The resulting slurry was formed into a green sheet by a doctor blade method. The thickness of the green sheet was adjusted to about 40 μm. Then, the green sheet was cut into elongated strips, and an electroconductive paste including Pd was screen-printed on the strips to form the opposing electrodes. Subsequently, a plurality of green sheets including green sheets on which the electroconductive paste were applied to form the opposing electrodes were stacked one on top of another. The stack was pressed and cut into green chips measuring about 2.0 mm by about 1.2 mm by about 1.2 mm. In each green chip, the opposing electrodes were adjusted so as to overlap each other with an opposing area of about 1 $mm^2$.

Then, the green chip was degreased at about 550° C. in air, subsequently fired at about 1400° C. for about 2 hours in air, and was then subjected to reduction at an appropriate temperature of about 600° C. to about 1200° C. for about 4 hours in an atmosphere of nitrogen including about 3% of hydrogen.

An electroconductive paste including Ag was applied on the elementary body after firing to form the terminal electrodes and was burned at about 750° C. in air. The resulting samples were subjected to evaluation tests.

The test samples were subjected to electroforming for correct evaluation by applying pulsed voltages of about 100 V to about 200 V with a pulse width of about 100 ms about 10 times to about 50 times in each of the positive direction and the opposite direction, and then the I-V characteristics were evaluated.

For the I-V characteristics evaluation, voltages were swept in this order: 0 V→predetermined voltage (positive)→0 V→predetermined voltage (negative)→0 V, using a pulse source meter ADVANTEST R6246. The voltages were pulsed and the measurements were taken at a pulse width of about 0.1 s. FIG. 2 shows an example of the I-V curves thus produced. The I-V characteristics shown in FIG. 2 are those of Sample 8.

The absolute value (corresponding to [6] in FIG. 2) of the switching voltage and the maximum resistance variation when a low resistance state changes into a high resistance state were obtained from the I-V characteristics. The maximum resistance variation was measured at a voltage greater than about 10 V in the polarity (negative in FIG. 2) at the time when the low resistance state changes into the high resistance state, at which the difference between the low resistance state and the high resistance state is the greatest, and calculated from the equation: Resistance variation (%)=$(\rho H-\rho L)/\rho L\times 100$, wherein $\rho H$ represents the resistance in a high resistance state and $\rho L$ represents the resistance in a low resistance state. For example, the maximum resistance variation of Sample 8 shown in FIG. 2 was obtained at a voltage of about −10 V or less (absolute value of about 10 V or more), at which the resistance variation was the greatest. The reason that the maximum resistance variation was obtained in that manner is that the resistances of resistance memory elements have voltage dependence.

Tables 1 to 5 show switching voltages and maximum resistance variations obtained as above.

TABLE 1

| Sample number | (Sr$_{1-x}$A$_x$)(Ti$_{1-y}$B$_y$)O$_3$ A | B | x | y | x + y | Switching voltage (V) | Maximum resistance variation (%) |
|---|---|---|---|---|---|---|---|
| 1 | La | — | 0.0005 | 0 | 0.005 | 62 | 3300 |
| 2 | La | — | 0.001 | 0 | 0.001 | 59 | 5400 |
| 3 | La | — | 0.003 | 0 | 0.003 | 55 | 6950 |
| 4 | La | — | 0.004 | 0 | 0.004 | 56 | 7500 |
| 5 | La | — | 0.005 | 0 | 0.005 | 55 | 11500 |
| 6 | La | — | 0.006 | 0 | 0.006 | 51 | 15600 |
| 7 | La | — | 0.007 | 0 | 0.007 | 51 | 20100 |
| 8 | La | — | 0.008 | 0 | 0.008 | 48 | 29500 |
| 9 | La | — | 0.009 | 0 | 0.009 | 48 | 18000 |
| 10 | La | — | 0.010 | 0 | 0.010 | 45 | 12500 |
| 11 | La | — | 0.020 | 0 | 0.020 | 59 | 6250 |
| 12 | La | — | 0.030 | 0 | 0.030 | 44 | 2300 |
| 13 | Nd | — | 0.0005 | 0 | 0.0005 | 51 | 3210 |
| 14 | Nd | — | 0.001 | 0 | 0.001 | 45 | 6000 |
| 15 | Nd | — | 0.003 | 0 | 0.003 | 51 | 6450 |
| 16 | Nd | — | 0.005 | 0 | 0.005 | 52 | 10800 |
| 17 | Nd | — | 0.008 | 0 | 0.008 | 48 | 24050 |
| 18 | Nd | — | 0.009 | 0 | 0.009 | 55 | 21000 |
| 19 | Nd | — | 0.010 | 0 | 0.010 | 56 | 11970 |
| 20 | Nd | — | 0.020 | 0 | 0.020 | 48 | 7250 |
| 21 | Nd | — | 0.030 | 0 | 0.030 | 52 | 3120 |
| 22 | Sm | — | 0.0005 | 0 | 0.0005 | 48 | 2500 |
| 23 | Sm | — | 0.001 | 0 | 0.001 | 51 | 5910 |
| 24 | Sm | — | 0.003 | 0 | 0.003 | 45 | 6800 |
| 25 | Sm | — | 0.005 | 0 | 0.005 | 60 | 11200 |
| 26 | Sm | — | 0.008 | 0 | 0.008 | 58 | 26800 |
| 27 | Sm | — | 0.009 | 0 | 0.009 | 54 | 20050 |
| 28 | Sm | — | 0.010 | 0 | 0.010 | 56 | 11250 |
| 29 | Sm | — | 0.020 | 0 | 0.020 | 55 | 6200 |
| 30 | Sm | — | 0.030 | 0 | 0.030 | 55 | 3500 |

TABLE 2

| Sample number | (Sr$_{1-x}$A$_x$)(Ti$_{1-y}$B$_y$)O$_3$ A | B | x | y | x + y | Switching voltage (V) | Maximum resistance variation (%) |
|---|---|---|---|---|---|---|---|
| 31 | Gd | — | 0.0005 | 0 | 0.0005 | 50 | 2000 |
| 32 | Gd | — | 0.001 | 0 | 0.001 | 57 | 5410 |
| 33 | Gd | — | 0.003 | 0 | 0.003 | 62 | 7150 |
| 34 | Gd | — | 0.005 | 0 | 0.005 | 48 | 11640 |
| 35 | Gd | — | 0.008 | 0 | 0.008 | 49 | 25600 |
| 36 | Gd | — | 0.009 | 0 | 0.009 | 55 | 17800 |
| 37 | Gd | — | 0.010 | 0 | 0.010 | 51 | 13200 |
| 38 | Gd | — | 0.020 | 0 | 0.020 | 48 | 5900 |
| 39 | Gd | — | 0.030 | 0 | 0.030 | 48 | 2250 |
| 40 | Ho | — | 0.0005 | 0 | 0.0005 | 52 | 2430 |
| 41 | Ho | — | 0.001 | 0 | 0.001 | 56 | 5460 |
| 42 | Ho | — | 0.003 | 0 | 0.003 | 54 | 7000 |
| 43 | Ho | — | 0.005 | 0 | 0.005 | 52 | 12630 |
| 44 | Ho | — | 0.008 | 0 | 0.008 | 56 | 24690 |
| 45 | Ho | — | 0.009 | 0 | 0.009 | 56 | 20460 |
| 46 | Ho | — | 0.010 | 0 | 0.010 | 55 | 11560 |
| 47 | Ho | — | 0.020 | 0 | 0.020 | 48 | 6500 |
| 48 | Ho | — | 0.030 | 0 | 0.030 | 48 | 3100 |
| 49 | Dy | — | 0.0005 | 0 | 0.0005 | 46 | 3000 |
| 50 | Dy | — | 0.001 | 0 | 0.001 | 51 | 6120 |
| 51 | Dy | — | 0.003 | 0 | 0.003 | 56 | 6500 |
| 52 | Dy | — | 0.005 | 0 | 0.005 | 55 | 11250 |
| 53 | Dy | — | 0.008 | 0 | 0.008 | 56 | 24530 |
| 54 | Dy | — | 0.009 | 0 | 0.009 | 54 | 15300 |
| 55 | Dy | — | 0.010 | 0 | 0.010 | 51 | 10800 |
| 56 | Dy | — | 0.020 | 0 | 0.020 | 56 | 7150 |
| 57 | Dy | — | 0.030 | 0 | 0.030 | 53 | 3250 |

TABLE 3

| Sample number | (Sr$_{1-x}$A$_x$)(Ti$_{1-y}$B$_y$)O$_3$ A | B | x | y | x + y | Switching voltage (V) | Maximum resistance variation (%) |
|---|---|---|---|---|---|---|---|
| 58 | Y | — | 0.0005 | 0 | 0.0005 | 45 | 2750 |
| 59 | Y | — | 0.001 | 0 | 0.001 | 49 | 5690 |
| 60 | Y | — | 0.003 | 0 | 0.003 | 51 | 7450 |
| 61 | Y | — | 0.005 | 0 | 0.005 | 58 | 12500 |
| 62 | Y | — | 0.008 | 0 | 0.008 | 54 | 27400 |
| 63 | Y | — | 0.009 | 0 | 0.009 | 48 | 19500 |
| 64 | Y | — | 0.010 | 0 | 0.010 | 49 | 11680 |
| 65 | Y | — | 0.020 | 0 | 0.020 | 45 | 6500 |
| 66 | Y | — | 0.030 | 0 | 0.030 | 48 | 2450 |
| 67 | — | Nb | 0 | 0.0005 | 0.0005 | 68 | 3000 |
| 68 | — | Nb | 0 | 0.001 | 0.001 | 65 | 6200 |
| 69 | — | Nb | 0 | 0.003 | 0.003 | 51 | 7150 |
| 70 | — | Nb | 0 | 0.004 | 0.004 | 50 | 7200 |
| 71 | — | Nb | 0 | 0.005 | 0.005 | 47 | 10500 |
| 72 | — | Nb | 0 | 0.006 | 0.006 | 43 | 15500 |
| 73 | — | Nb | 0 | 0.007 | 0.007 | 42 | 17800 |
| 74 | — | Nb | 0 | 0.008 | 0.008 | 42 | 16200 |
| 75 | — | Nb | 0 | 0.009 | 0.009 | 40 | 12100 |
| 76 | — | Nb | 0 | 0.010 | 0.010 | 39 | 10500 |
| 77 | — | Nb | 0 | 0.020 | 0.020 | 41 | 7200 |
| 78 | — | Nb | 0 | 0.030 | 0.030 | 35 | 3100 |
| 79 | — | Ta | 0 | 0.0005 | 0.0005 | 51 | 2500 |
| 80 | — | Ta | 0 | 0.001 | 0.001 | 45 | 6100 |
| 81 | — | Ta | 0 | 0.003 | 0.003 | 51 | 6400 |
| 82 | — | Ta | 0 | 0.005 | 0.005 | 52 | 10500 |
| 83 | — | Ta | 0 | 0.008 | 0.008 | 48 | 18500 |
| 84 | — | Ta | 0 | 0.009 | 0.009 | 55 | 20000 |
| 85 | — | Ta | 0 | 0.010 | 0.010 | 56 | 13500 |
| 86 | — | Ta | 0 | 0.020 | 0.020 | 48 | 7000 |
| 87 | — | Ta | 0 | 0.030 | 0.030 | 52 | 3200 |

TABLE 4

| Sample number | (Sr$_{1-x}$A$_x$)(Ti$_{1-y}$B$_y$)O$_3$ A | B | x | y | x + y | Switching voltage (V) | Maximum resistance variation (%) |
|---|---|---|---|---|---|---|---|
| 88 | La | Nb | 0.0002 | 0.0003 | 0.0005 | 49 | 3100 |
| 89 | La | Nb | 0.0005 | 0.0005 | 0.001 | 56 | 7000 |
| 90 | La | Nb | 0.003 | 0.002 | 0.005 | 54 | 10500 |
| 91 | La | Nb | 0.005 | 0.005 | 0.01 | 55 | 12200 |
| 92 | La | Nb | 0.01 | 0.01 | 0.02 | 56 | 8800 |
| 93 | La | Nb | 0.02 | 0.01 | 0.03 | 57 | 4100 |
| 94 | La | Ta | 0.0002 | 0.0003 | 0.0005 | 48 | 2800 |
| 95 | La | Ta | 0.0005 | 0.0005 | 0.001 | 50 | 8100 |
| 96 | La | Ta | 0.003 | 0.002 | 0.005 | 51 | 11200 |
| 97 | La | Ta | 0.005 | 0.005 | 0.01 | 52 | 12000 |
| 98 | La | Ta | 0.01 | 0.01 | 0.02 | 56 | 8100 |
| 99 | La | Ta | 0.02 | 0.01 | 0.03 | 55 | 3900 |
| 100 | Sm | Nb | 0.0002 | 0.0003 | 0.0005 | 56 | 3000 |
| 101 | Sm | Nb | 0.0005 | 0.0005 | 0.001 | 54 | 6900 |
| 102 | Sm | Nb | 0.003 | 0.002 | 0.005 | 52 | 10500 |
| 103 | Sm | Nb | 0.005 | 0.005 | 0.01 | 60 | 11500 |
| 104 | Sm | Nb | 0.01 | 0.01 | 0.02 | 51 | 9200 |
| 105 | Sm | Nb | 0.02 | 0.01 | 0.03 | 59 | 4000 |
| 106 | Sm | Ta | 0.0002 | 0.0003 | 0.0005 | 55 | 2600 |
| 107 | Sm | Ta | 0.0005 | 0.0005 | 0.001 | 55 | 9100 |
| 108 | Sm | Ta | 0.003 | 0.002 | 0.005 | 56 | 12000 |
| 109 | Sm | Ta | 0.005 | 0.005 | 0.01 | 51 | 11000 |
| 110 | Sm | Ta | 0.01 | 0.01 | 0.02 | 59 | 8600 |
| 111 | Sm | Ta | 0.02 | 0.01 | 0.03 | 52 | 3600 |
| 112 | Gd | Nb | 0.0002 | 0.0003 | 0.0005 | 52 | 4000 |
| 113 | Gd | Nb | 0.0005 | 0.0005 | 0.001 | 56 | 7700 |
| 114 | Gd | Nb | 0.003 | 0.002 | 0.005 | 56 | 10200 |
| 115 | Gd | Nb | 0.005 | 0.005 | 0.01 | 57 | 11500 |
| 116 | Gd | Nb | 0.01 | 0.01 | 0.02 | 55 | 8100 |
| 117 | Gd | Nb | 0.02 | 0.01 | 0.03 | 54 | 3400 |

TABLE 5

| Sample number | A | B | $(Sr_{1-x}A_x)(Ti_{1-y}B_y)O_3$ x | y | x + y | Switching voltage (V) | Maximum resistance variation (%) |
|---|---|---|---|---|---|---|---|
| 118 | Gd | Ta | 0.0002 | 0.0003 | 0.0005 | 49 | 3400 |
| 119 | Gd | Ta | 0.0005 | 0.0005 | 0.001 | 52 | 7400 |
| 120 | Gd | Ta | 0.003 | 0.002 | 0.005 | 50 | 10500 |
| 121 | Gd | Ta | 0.005 | 0.005 | 0.01 | 48 | 13500 |
| 122 | Gd | Ta | 0.01 | 0.01 | 0.02 | 55 | 8200 |
| 123 | Gd | Ta | 0.02 | 0.01 | 0.03 | 56 | 4000 |
| 124 | Dy | Nb | 0.0002 | 0.0003 | 0.0005 | 48 | 2600 |
| 125 | Dy | Nb | 0.0005 | 0.0005 | 0.001 | 47 | 7500 |
| 126 | Dy | Nb | 0.003 | 0.002 | 0.005 | 48 | 11500 |
| 127 | Dy | Nb | 0.005 | 0.005 | 0.01 | 52 | 13000 |
| 128 | Dy | Nb | 0.01 | 0.01 | 0.02 | 55 | 8200 |
| 129 | Dy | Nb | 0.02 | 0.01 | 0.03 | 54 | 3200 |
| 130 | Dy | Ta | 0.0002 | 0.0003 | 0.0005 | 55 | 4200 |
| 131 | Dy | Ta | 0.0005 | 0.0005 | 0.001 | 59 | 7800 |
| 132 | Dy | Ta | 0.003 | 0.002 | 0.005 | 58 | 11500 |
| 133 | Dy | Ta | 0.005 | 0.005 | 0.01 | 55 | 15000 |
| 134 | Dy | Ta | 0.01 | 0.01 | 0.02 | 57 | 8700 |
| 135 | Dy | Ta | 0.02 | 0.01 | 0.03 | 49 | 3200 |
| 136 | Y | Nb | 0.0002 | 0.0003 | 0.0005 | 52 | 3600 |
| 137 | Y | Nb | 0.0005 | 0.0005 | 0.001 | 54 | 6900 |
| 138 | Y | Nb | 0.003 | 0.002 | 0.005 | 55 | 10800 |
| 139 | Y | Nb | 0.005 | 0.005 | 0.01 | 51 | 12600 |
| 140 | Y | Nb | 0.01 | 0.01 | 0.02 | 56 | 8400 |
| 141 | Y | Nb | 0.02 | 0.01 | 0.03 | 52 | 3900 |
| 142 | Y | Ta | 0.0002 | 0.0003 | 0.0005 | 53 | 4200 |
| 143 | Y | Ta | 0.0005 | 0.0005 | 0.001 | 55 | 8800 |
| 144 | Y | Ta | 0.003 | 0.002 | 0.005 | 54 | 13000 |
| 145 | Y | Ta | 0.005 | 0.005 | 0.01 | 59 | 12500 |
| 146 | Y | Ta | 0.01 | 0.01 | 0.02 | 52 | 9400 |
| 147 | Y | Ta | 0.02 | 0.01 | 0.03 | 50 | 3100 |

Samples having the preferred composition of the strontium titanate-based semiconductor ceramic of the elementary body satisfying the relationships $0.001 \leqq x+y \leqq 0.02$, $0 \leqq x \leqq 0.02$, and $0 \leqq y \leqq 0.02$ are 2 to 11, 14 to 20, 23 to 29, 32 to 38, 41 to 47, 50 to 56, 59 to 65, 68 to 77, and 80 to 86. These samples had resistance variations of at least about 5,000%.

On the other hand, in samples 1, 13, 22, 31, 40, 49, 58, 67, and 79, in which the sum of x (amount of the substituent La, Nd, Sm, Gd, Ho, Dy, or Y added as a donor to the Sr site) and y (amount of the substituent Nb or Ta added as a donor to the Ti site), x+y, was less than about 0.001, the strontium titanate-based ceramic did not turn into semiconductor due to an insufficient amount of donor, and did not form sufficient Schottky barriers at the interfaces with the opposing electrodes. Consequently, the resistance variation was less than about 5,000%.

In Samples 12, 21, 30, 39, 48, 57, 66, 78, and 87, in which x (amount of substituent La, Nd, Sm, Gd, Ho, Dy, or Y) was greater than about 0.02 and y (amount of substituent Nb or Ta) was greater than about 0.02, or the sum of x and y, x+y, was greater than about 0.02, the switching voltage was at least about 10 V, but the resistance of the ceramic was excessively low because of an excessive amount of donor. Consequently, the height of Schottky barriers was reduced and the resistance variation resulted in less than about 5,000%, while some of the samples exhibited hysteresis in the I-V characteristics.

Among the Samples satisfying the preferred ranges: 2 to 11, 14 to 20, 23 to 29, 32 to 38, 41 to 47, 50 to 56, 59 to 65, 68 to 77, and 80 to 86, the Samples satisfying $0.005 \leqq x+y \leqq 0.01$: 5 to 10, 16 to 20, 25 to 28, 34 to 38, 43 to 46, 52 to 55, 61 to 64, 71 to 76, and 82 to 85 had greater resistance variations of, for example, at least about 10,000%, than the other Samples 2 to 4, 11, 14, 15, 20, 23, 24, 29, 32, 33, 38, 41, 42, 47, 50, 51, 56, 59, 60, 65, 68 to 70, 77, 80, 81, and 86. This shows that by appropriately controlling the amount of donor, optimal Schottky barriers and grain boundaries can be produced.

In addition, the comparison between Samples 1 to 12 and Samples 13 to 66 suggests that even if Y or another rare earth element is substituted for the La in the strontium titanate-based semiconductor ceramic, the ion radius is not significantly influenced, and that a large effect can be produced by adding Y or other rare earth metals in a proportion within the range of the preferred embodiments of the present invention.

Experiment 2

In Experiment 2, the strontium titanate-based semiconductor ceramic of the elementary body having substantially the same composition as Sample 8 in Experiment 1 was prepared, and samples were formed in the same process as in Experiment 1 according to Table 6, and varying the thickness of the green sheets and the firing temperature. Table 6 shows the thickness between the opposing electrodes depending on the thickness of the green sheet and the firing temperature. The reducing conditions depend on the firing temperature and the thickness of the green sheet (between the opposing electrodes). Accordingly, the reducing temperature after firing was appropriately selected from the range of about 600° C. to about 1200° C. for each sample.

In Experiment 2, the maximum resistance variation and the switching voltage were measured as in Experiment 1, and, in addition, the average particle size of the strontium titanate-based semiconductor ceramic and the average number of grain boundaries present between the opposing electrodes were determined. The results are shown in Table 6.

The thickness between the opposing electrodes, the average particle size, and the average number of grain boundaries were determined by observing a fracture plane of the elementary body after firing through a field emission scanning electron microscope (FE-SEM). The average particle size was an average of the particle sizes of about ten particles in the fracture plane, and the number of grain boundaries was indirectly defined by the expression: (thickness of the opposing electrodes/average particle size) −1.

TABLE 6

| Sample number | Thickness between opposing electrodes (μm) | Firing temperature (° C.) | Average particle size (μm) | Average number of grain boundaries | Maximum resistance variation (%) | Switching voltage (V) |
|---|---|---|---|---|---|---|
| 201 | 20 | 1300 | 1.1 | 17.2 | 12500 | 55 |
| 202 | 30 | 1300 | 1.1 | 26.3 | 11000 | 64 |
| 203 | 50 | 1300 | 1.1 | 44.5 | 10500 | 72 |
| 204 | 75 | 1300 | 1.1 | 67.2 | 6700 | 80 |
| 205 | 100 | 1300 | 1.1 | 89.9 | 5500 | 84 |
| 206 | 10 | 1350 | 2.8 | 2.6 | 12300 | 45 |
| 207 | 20 | 1350 | 2.8 | 6.1 | 15400 | 54 |

TABLE 6-continued

| Sample number | Thickness between opposing electrodes (μm) | Firing temperature (° C.) | Average particle size (μm) | Average number of grain boundaries | Maximum resistance variation (%) | Switching voltage (V) |
|---|---|---|---|---|---|---|
| 208 | 30 | 1350 | 2.8 | 9.7 | 16800 | 59 |
| 209 | 50 | 1350 | 2.8 | 16.9 | 15000 | 67 |
| 210 | 75 | 1350 | 2.8 | 25.8 | 15200 | 70 |
| 211 | 100 | 1350 | 2.8 | 34.7 | 16200 | 84 |
| 212 | 6 | 1400 | 5.5 | 0.1 | 6400 | 20 |
| 213 | 8 | 1400 | 5.5 | 0.5 | 17100 | 23 |
| 214 | 10 | 1400 | 5.5 | 0.8 | 19500 | 34 |
| 215 | 20 | 1400 | 5.5 | 2.6 | 22000 | 40 |
| 216 | 30 | 1400 | 5.5 | 4.5 | 29500 | 50 |
| 217 | 50 | 1400 | 5.5 | 8.1 | 21500 | 59 |
| 218 | 75 | 1400 | 5.5 | 12.6 | 20050 | 64 |
| 219 | 100 | 1400 | 5.5 | 17.2 | 19000 | 70 |
| 220 | 10 | 1450 | 8.7 | 0.1 | 6700 | 27 |
| 221 | 20 | 1450 | 8.7 | 1.3 | 10800 | 33 |
| 222 | 30 | 1450 | 8.7 | 2.4 | 11000 | 45 |
| 223 | 50 | 1450 | 8.7 | 4.7 | 14500 | 52 |
| 224 | 75 | 1450 | 8.7 | 7.6 | 17100 | 61 |
| 225 | 100 | 1450 | 8.7 | 10.5 | 18600 | 68 |

Table 6 shows that the switching voltage greatly depends on the thickness between the opposing electrodes, such that as the thickness is reduced, the switching voltage is reduced.

As for the average number of grain boundaries, Samples 212 and 220, in which the average number of grain boundaries was less than about 0.5, resulted in a resistance variation of less than about 10,000%. These results suggest that a high resistance variation obtained in preferred embodiments of the present invention depends not only on the height of the Schottky barriers at the interfaces with the electrodes, but also on the number of grain boundaries. In order to achieve a high resistance variation, grain boundaries are required to some extent.

In samples 204 and 205, in which the average number of grain boundaries was greater than about 44.5, the resistance variation was less than about 10,000%. This may be because as the number of grain boundaries is increased, the boundary resistance components are increased and the resistance variation is reduced accordingly.

On the other hand, Samples 201 to 203, 206 to 211, 213 to 219, and 221 to 225, in which the average number of grain boundaries is in the range of about 0.5 to about 44.5, exhibited resistance variations of at least about 10,000% independent of the thickness between the opposing electrodes.

These results suggest that by controlling the thickness between the opposing electrodes and the average number of grain boundaries, the switching voltage can be effectively controlled and the resistance variation can be increased.

Experiment 3

In Experiment 3, strontium titanate-based semiconductor ceramics having the following compositions were prepared for the elementary body:

(1) compositions expressed by $(Sr_{1-x}A_x)_vTi_wO_3$, wherein x (amount of the substituent "A": La, Nd, Sm, Gd, Dy, Ho, or Y added to the Sr site as a donor) and the ratio v/w of the Sr site to the Ti site were varied as shown in Tables 7 to 13;

(2) compositions expressed by $Sr_v(Ti_{1-y}B_y)_wO_3$, wherein y (amount of the substituent "B": Nb or Ta added to the Ti site as a donor) and the ratio v/w of the Sr site to the Ti site were varied as shown in Tables 14 and 15; and (3) compositions expressed by $(Sr_{1-x}A_x)_v(Ti_{1-y}Nb_y)_wO_3$, wherein the sum of x (amount of the substituent "A": La, Sm, Gd, Dy, or Y added to the Sr site as a donor) and y (amount of Nb substitution), x+y, and the ratio v/w of the Sr site to the Ti site were varied as shown in Tables 16 to 20.

In the compositions of (1), y=0 holds, and x is equal to x+y. In the compositions of (2), x=0 holds, and y is equal to x+y.

The other conditions were substantially the same as in Experiment 1. Samples for evaluation were thus prepared, and the maximum resistance variation was determined in the same manner as in Experiment 1. Tables 7 to 20 show the maximum resistance variation (%). Blank cells not showing maximum resistance variation in Tables 7 to 20 mean that resistance switching did not occur or the resistance variation was too small.

TABLE 7

| | | v/w | | | | | | | | | | |
|---|---|---|---|---|---|---|---|---|---|---|---|---|
| | | 0.85 | 0.87 | 0.900 | 0.950 | 0.990 | 0.995 | 1.000 | 1.010 | 1.030 | 1.050 | 1.100 |
| La substitution x | 0 | — | — | — | — | — | — | — | — | — | — | — |
| | 0.0005 | — | — | — | — | — | — | 3300 | — | — | — | — |
| | 0.001 | 3100 | 5250 | 5200 | 5450 | 6200 | 5500 | 5400 | 5500 | 5100 | — | — |
| | 0.003 | 3000 | 5540 | 6350 | 6250 | 6900 | 7150 | 6950 | 6200 | 5800 | — | — |
| | 0.005 | 2500 | 5600 | 8750 | 10550 | 11400 | 11250 | 11500 | 10600 | 8150 | 1200 | — |
| | 0.008 | 3050 | 9500 | 9900 | 19800 | 21450 | 26300 | 29500 | 19000 | 9200 | 2000 | — |
| | 0.010 | 2250 | 6100 | 6900 | 10500 | 11500 | 11200 | 12500 | 10500 | 7150 | — | — |
| | 0.020 | — | 5200 | 5890 | 6020 | 6150 | 6300 | 6250 | 5450 | 5200 | — | — |
| | 0.030 | — | — | 1100 | 1950 | 3150 | 2200 | 2300 | 2100 | 1000 | — | — |

TABLE 8

| | | v/w | | | | | | | | | | |
|---|---|---|---|---|---|---|---|---|---|---|---|---|
| | | 0.85 | 0.87 | 0.900 | 0.950 | 0.990 | 0.995 | 1.000 | 1.010 | 1.030 | 1.050 | 1.100 |
| Nd | 0 | — | — | — | — | — | — | — | — | — | — | — |
| substitution x | 0.0005 | — | 2200 | 1500 | — | — | — | 3210 | — | 1500 | — | — |
| | 0.001 | 3300 | 5650 | 5300 | 5200 | 6350 | 5600 | 6000 | 5150 | 5500 | — | — |
| | 0.003 | 3000 | 6100 | 5800 | 6500 | 7150 | 7000 | 6450 | 6200 | 5500 | 1580 | — |
| | 0.005 | 3550 | 6150 | 9100 | 10020 | 10500 | 10500 | 10800 | 11000 | 9600 | 3000 | — |
| | 0.008 | 2250 | 7850 | 9500 | 13500 | 16800 | 20050 | 24050 | 18750 | 9500 | 1900 | — |
| | 0.010 | 2150 | 6150 | 9500 | 19755 | 12600 | 15000 | 11970 | 11500 | 7000 | 2500 | — |
| | 0.020 | — | 5400 | 6150 | 5700 | 5950 | 5850 | 7250 | 6000 | 5150 | — | — |
| | 0.030 | — | 1500 | 2200 | 2300 | 2500 | 3000 | 3120 | 2150 | 1600 | — | — |

TABLE 9

| | | v/w | | | | | | | | | | |
|---|---|---|---|---|---|---|---|---|---|---|---|---|
| | | 0.85 | 0.87 | 0.900 | 0.950 | 0.990 | 0.995 | 1.000 | 1.010 | 1.030 | 1.050 | 1.100 |
| Sm | 0 | — | — | — | — | — | — | — | — | — | — | — |
| substitution x | 0.0005 | — | — | 2000 | 1500 | — | 1500 | 2500 | — | — | 2100 | — |
| | 0.001 | — | 5600 | 5300 | 5500 | 6000 | 5690 | 5910 | 5760 | 5250 | — | — |
| | 0.003 | 1500 | 5050 | 5750 | 6000 | 7500 | 7840 | 6800 | 6550 | 5700 | — | — |
| | 0.005 | 3000 | 7150 | 9500 | 17000 | 12100 | 12000 | 11200 | 10700 | 8500 | 1200 | — |
| | 0.008 | 3100 | 8850 | 9150 | 17800 | 15800 | 22000 | 26800 | 21400 | 8900 | 3360 | — |
| | 0.010 | 2300 | 6450 | 7000 | 11100 | 11900 | 12000 | 11250 | 10000 | 6800 | — | — |
| | 0.020 | — | 5150 | 5080 | 7150 | 7000 | 6250 | 6200 | 5700 | 5400 | — | — |
| | 0.030 | — | — | 2200 | 2560 | — | 2300 | 3500 | 2200 | 1500 | — | — |

TABLE 10

| | | v/w | | | | | | | | | | |
|---|---|---|---|---|---|---|---|---|---|---|---|---|
| | | 0.85 | 0.87 | 0.900 | 0.950 | 0.990 | 0.995 | 1.000 | 1.010 | 1.030 | 1.050 | 1.100 |
| Gd | 0 | — | — | — | — | — | — | — | — | — | — | — |
| substitution x | 0.0005 | — | — | — | — | — | — | 2000 | 2150 | 2200 | — | — |
| | 0.001 | 3200 | 5050 | 5100 | 5400 | 6500 | 5400 | 5410 | 5450 | 5300 | — | — |
| | 0.003 | 1560 | 5500 | 5500 | 5150 | 8850 | 7200 | 7150 | 6800 | 5750 | 3150 | — |
| | 0.005 | 2900 | 5400 | 7900 | 10550 | 11400 | 11250 | 11640 | 10600 | 8150 | 1200 | — |
| | 0.008 | 3650 | 7850 | 8900 | 19500 | 20000 | 22050 | 25600 | 17500 | 9350 | 1900 | — |
| | 0.010 | 3200 | 5700 | 6250 | 11500 | 12000 | 12500 | 13200 | 11900 | 8450 | — | — |
| | 0.020 | — | 5180 | 5590 | 6350 | 6050 | 6000 | 5900 | 5800 | 5150 | 2260 | — |
| | 0.030 | — | 1250 | — | 1160 | 2290 | 3150 | 2250 | 3050 | 2200 | — | — |

TABLE 11

| | | v/w | | | | | | | | | | |
|---|---|---|---|---|---|---|---|---|---|---|---|---|
| | | 0.85 | 0.87 | 0.900 | 0.950 | 0.990 | 0.995 | 1.000 | 1.010 | 1.030 | 1.050 | 1.100 |
| Dy | 0 | — | — | — | — | — | — | — | — | — | — | — |
| substitution x | 0.0005 | — | — | 2150 | — | — | 1100 | 2340 | — | — | — | — |
| | 0.001 | 2900 | 5150 | 5350 | 5450 | 6000 | 5500 | 5460 | 5600 | 5500 | 1500 | — |
| | 0.003 | 2250 | 5840 | 6500 | 6350 | 7100 | 7750 | 7000 | 6150 | 5600 | — | — |
| | 0.005 | 3150 | 5690 | 8750 | 10700 | 10800 | 12100 | 12630 | 11100 | 7770 | 2100 | — |
| | 0.008 | 4150 | 8870 | 9360 | 17600 | 20360 | 22900 | 24690 | 18750 | 8450 | 2000 | — |
| | 0.010 | 1590 | 5890 | 6250 | 11200 | 12000 | 12500 | 11560 | 11360 | 8940 | 2360 | — |
| | 0.020 | — | 5450 | 6150 | 6200 | 6000 | 6150 | 6500 | 5600 | 5600 | 2560 | — |
| | 0.030 | — | 2500 | 1260 | 1055 | 3250 | 1560 | 3100 | 3250 | 2210 | — | — |

TABLE 12

| | | v/w | | | | | | | | | | |
|---|---|---|---|---|---|---|---|---|---|---|---|---|
| | | 0.85 | 0.87 | 0.900 | 0.950 | 0.990 | 0.995 | 1.00 | 1.010 | 1.030 | 1.050 | 1.100 |
| Ho | 0 | — | — | — | — | — | — | — | — | — | — | — |
| substitution x | 0.0005 | — | 2250 | — | — | — | — | 3000 | — | — | — | — |

TABLE 12-continued

| | | v/w | | | | | | | | | | |
|---|---|---|---|---|---|---|---|---|---|---|---|---|
| | | 0.85 | 0.87 | 0.900 | 0.950 | 0.990 | 0.995 | 1.00 | 1.010 | 1.030 | 1.050 | 1.100 |
| | 0.001 | 1980 | 5150 | 5300 | 5400 | 6300 | 5400 | 6120 | 5650 | 5160 | — | — |
| | 0.003 | 2500 | 5640 | 6100 | 7580 | 7150 | 7030 | 6500 | 6540 | 6000 | — | — |
| | 0.005 | 3100 | 6250 | 8760 | 12400 | 13200 | 15450 | 11250 | 11600 | 7950 | 1200 | — |
| | 0.008 | 2250 | 5560 | 9580 | 13580 | 19400 | 20500 | 24530 | 20300 | 9700 | 2000 | — |
| | 0.010 | 2100 | 6540 | 7100 | 12100 | 11500 | 10580 | 10800 | 11200 | 7050 | 1500 | — |
| | 0.020 | — | 5150 | 5580 | 5810 | 6450 | 6500 | 7150 | 6150 | 5450 | — | — |
| | 0.030 | — | — | 1500 | 2150 | 3200 | 2550 | 3250 | 2500 | 1200 | — | — |

TABLE 13

| | | v/w | | | | | | | | | | |
|---|---|---|---|---|---|---|---|---|---|---|---|---|
| | | 0.85 | 0.87 | 0.900 | 0.950 | 0.990 | 0.995 | 1.000 | 1.010 | 1.030 | 1.050 | 1.100 |
| Y | 0 | — | — | — | — | — | — | — | — | — | — | — |
| substitution x | 0.0005 | — | — | — | — | — | — | 2750 | — | — | — | — |
| | 0.001 | 2900 | 5150 | 5300 | 5490 | 6150 | 6600 | 5690 | 5150 | 5100 | — | — |
| | 0.003 | 2250 | 5400 | 6000 | 6150 | 7800 | 8560 | 7450 | 6350 | 5450 | — | — |
| | 0.005 | 2450 | 6100 | 7980 | 10100 | 12500 | 12000 | 12500 | 10100 | 7800 | 2650 | — |
| | 0.008 | 3200 | 8950 | 8900 | 14500 | 23000 | 22450 | 27400 | 17580 | 9000 | 1690 | — |
| | 0.010 | 2560 | 6250 | 6610 | 11000 | 12500 | 12540 | 11680 | 11500 | 8150 | 3320 | — |
| | 0.020 | — | 5350 | 5600 | 5900 | 5800 | 6120 | 6500 | 5600 | 5150 | — | — |
| | 0.030 | — | — | — | 2050 | 3230 | 2450 | 2450 | 2560 | — | — | — |

TABLE 14

| | | v/w | | | | | | | | | | |
|---|---|---|---|---|---|---|---|---|---|---|---|---|
| | | 0.85 | 0.87 | 0.900 | 0.950 | 0.990 | 0.995 | 1.000 | 1.010 | 1.030 | 1.050 | 1.100 |
| Nb | 0 | — | — | — | — | — | — | — | — | — | — | — |
| substitution y | 0.0005 | — | — | — | — | — | — | 3000 | — | — | — | — |
| | 0.001 | 2850 | 5150 | 5500 | 5800 | 6400 | 6550 | 6200 | 5950 | 5300 | — | — |
| | 0.003 | 3300 | 5620 | 6400 | 6750 | 7140 | 7300 | 7150 | 6300 | 5950 | — | — |
| | 0.005 | 3100 | 6210 | 7750 | 10200 | 10500 | 11000 | 10500 | 10500 | 7850 | 2200 | — |
| | 0.008 | 1800 | 8780 | 9350 | 10900 | 12500 | 17500 | 16200 | 15200 | 9560 | 3500 | — |
| | 0.010 | 2680 | 5800 | 6800 | 10500 | 11500 | 11000 | 10500 | 10000 | 6840 | — | — |
| | 0.020 | — | 5100 | 6120 | 7050 | 7200 | 7150 | 7200 | 6200 | 5900 | — | — |
| | 0.030 | — | — | 1680 | 2500 | 3200 | 1800 | 3100 | 2450 | 1560 | — | — |

TABLE 15

| | | v/w | | | | | | | | | | |
|---|---|---|---|---|---|---|---|---|---|---|---|---|
| | | 0.85 | 0.87 | 0.9 | 0.95 | 0.990 | 0.995 | 1.000 | 1.010 | 1.030 | 1.050 | 1.100 |
| Ta | 0 | — | — | — | — | — | — | — | — | — | — | — |
| substitution y | 0.0005 | 2100 | — | 1500 | — | — | — | 2600 | — | 2200 | — | — |
| | 0.001 | 3000 | 5200 | 5450 | 5550 | 6000 | 6200 | 6100 | 5400 | 5400 | — | — |
| | 0.003 | 1990 | 5950 | 5500 | 6250 | 7550 | 7100 | 6400 | 6400 | 5500 | 2200 | — |
| | 0.005 | 2870 | 5900 | 7500 | 11000 | 11800 | 12300 | 10500 | 10500 | 7700 | 3550 | — |
| | 0.008 | 3330 | 7560 | 8800 | 16200 | 19500 | 20000 | 18500 | 13500 | 9300 | 2000 | — |
| | 0.010 | 1500 | 6000 | 6700 | 12000 | 11500 | 13500 | 13500 | 12200 | 7900 | 2250 | — |
| | 0.020 | — | 5400 | 5700 | 5600 | 5950 | 6030 | 7000 | 5600 | 5050 | — | — |
| | 0.030 | — | — | — | 2050 | 3230 | 2200 | 3200 | 2600 | 1950 | — | — |

TABLE 16

| | | | v/w | | | | | | | | |
|---|---|---|---|---|---|---|---|---|---|---|---|
| La substitution x | Nb substitution y | x + y | 0.85 | 0.87 | 0.900 | 0.950 | 1.000 | 1.010 | 1.030 | 1.050 | 1.100 |
| 0.0002 | 0.0003 | 0.0005 | — | — | — | 2500 | 3100 | 3000 | — | — | — |
| 0.0005 | 0.0005 | 0.001 | — | 5200 | 5600 | 6000 | 7000 | 5900 | 5200 | 2000 | — |
| 0.003 | 0.002 | 0.005 | — | 5200 | 6700 | 11000 | 10500 | 10900 | 7200 | 3000 | — |
| 0.005 | 0.005 | 0.01 | 2800 | 6600 | 8100 | 10800 | 12200 | 10200 | 8300 | 3900 | — |

TABLE 16-continued

| La substitution x | Nb substitution y | x + y | v/w 0.85 | 0.87 | 0.900 | 0.950 | 1.000 | 1.010 | 1.030 | 1.050 | 1.100 |
|---|---|---|---|---|---|---|---|---|---|---|---|
| 0.01 | 0.01 | 0.02 | 3500 | 5500 | 6900 | 7000 | 8800 | 7400 | 7200 | 3400 | — |
| 0.01 | 0.02 | 0.03 | — | 4000 | 3600 | 3200 | 4100 | 4200 | 4100 | — | — |

TABLE 17

| Sm substitution x | Nb substitution y | x + y | v/w 0.85 | 0.87 | 0.900 | 0.950 | 1.000 | 1.010 | 1.030 | 1.050 | 1.100 |
|---|---|---|---|---|---|---|---|---|---|---|---|
| 0.0002 | 0.0003 | 0.0005 | — | — | 2500 | 3000 | 3000 | — | — | — | — |
| 0.0005 | 0.0005 | 0.001 | — | 5600 | 5400 | 7800 | 6900 | 6300 | 5900 | 3000 | — |
| 0.003 | 0.002 | 0.005 | 3200 | 6600 | 6700 | 12000 | 10500 | 11000 | 6300 | 2300 | — |
| 0.005 | 0.005 | 0.01 | 2200 | 6200 | 7050 | 11500 | 11500 | 10500 | 7700 | 2200 | 2300 |
| 0.01 | 0.01 | 0.02 | 2900 | 5300 | 7300 | 8800 | 9200 | 6500 | 7100 | 3200 | — |
| 0.01 | 0.02 | 0.03 | 1200 | — | 4100 | 3900 | 4000 | 4200 | 3600 | — | — |

TABLE 18

| Gd substitution x | Nb substitution y | x + y | v/w 0.85 | 0.87 | 0.900 | 0.950 | 1.000 | 1.010 | 1.030 | 1.050 | 1.100 |
|---|---|---|---|---|---|---|---|---|---|---|---|
| 0.0002 | 0.0003 | 0.0005 | — | 2200 | — | 2900 | 4000 | 3000 | — | — | — |
| 0.0005 | 0.0005 | 0.001 | 2500 | 5400 | 6100 | 7200 | 7700 | 8600 | 5600 | 2500 | — |
| 0.003 | 0.002 | 0.005 | 3000 | 6100 | 8200 | 12500 | 10200 | 11000 | 8000 | — | 3000 |
| 0.005 | 0.005 | 0.01 | 3500 | 5500 | 8000 | 12000 | 11500 | 10500 | 7900 | 3100 | 2200 |
| 0.01 | 0.01 | 0.02 | 2100 | 5200 | 8900 | 6900 | 8100 | 8800 | 6500 | 3500 | 1050 |
| 0.01 | 0.02 | 0.03 | — | — | 4200 | 4000 | 3400 | 3400 | 3600 | 2900 | — |

TABLE 19

| Dy substitution x | Nb substitution y | x + y | v/w 0.85 | 0.87 | 0.900 | 0.950 | 1.000 | 1.010 | 1.030 | 1.050 | 1.100 |
|---|---|---|---|---|---|---|---|---|---|---|---|
| 0.0002 | 0.0003 | 0.0005 | — | 2000 | — | 3500 | 2600 | — | — | 2200 | — |
| 0.0005 | 0.0005 | 0.001 | — | 5100 | 5900 | 6600 | 7500 | 6800 | 5600 | 3600 | — |
| 0.003 | 0.002 | 0.005 | 4500 | 6000 | 7600 | 11500 | 11500 | 11500 | 7200 | 2900 | — |
| 0.005 | 0.005 | 0.01 | 3500 | 7500 | 5900 | 12500 | 13000 | 11000 | 6900 | 4100 | — |
| 0.01 | 0.01 | 0.02 | 1900 | 5600 | 5500 | 6900 | 8200 | 6700 | 5200 | 3600 | 2300 |
| 0.01 | 0.02 | 0.03 | — | 2950 | — | 3600 | 3200 | 2500 | 3600 | 2900 | — |

TABLE 20

| Y substitution x | Nb substitution y | x + y | v/w 0.85 | 0.87 | 0.900 | 0.950 | 1.000 | 1.010 | 1.030 | 1.050 | 1.100 |
|---|---|---|---|---|---|---|---|---|---|---|---|
| 0.0002 | 0.0003 | 0.0005 | — | 1200 | — | — | 3600 | 3200 | 2600 | — | — |
| 0.0005 | 0.0005 | 0.001 | 1600 | 5900 | 5200 | 6200 | 6900 | 6000 | 5200 | 3600 | — |
| 0.003 | 0.002 | 0.005 | — | 5200 | 8400 | 13000 | 10800 | 10500 | 7500 | 2500 | 1500 |
| 0.005 | 0.005 | 0.01 | 3600 | 5900 | 9800 | 12700 | 12600 | 12000 | 7700 | 3100 | — |
| 0.01 | 0.01 | 0.02 | 3200 | 6000 | 7400 | 8000 | 8400 | 7700 | 5900 | — | — |
| 0.01 | 0.02 | 0.03 | — | 3900 | 4100 | 3600 | 3900 | 3000 | — | 3300 | — |

Tables 7 to 20 show that when v/w is in the range of about 0.87 to about 1.030 and the relationships $0.001 \leqq x+y \leqq 0.02$, $0 \leqq x \leqq 0.02$, and $0 \leqq y \leqq 0.02$ are satisfied, the resistance is varied at a rate of at least about 5,000%.

In addition, when v/w is in the range of about 0.950 to about 1.010, and x+y is in the range of about 0.005 to about 0.01, the resistance is varied at a rate of at least about 10,000%, so as exhibit superior characteristics.

However, when v/w is greater than about 1.030, excess Sr suppresses the growth of crystal grains to excessively increase the resistance. Consequently, the resistance does not switch. In contrast, when v/w is less than about 0.87, crystal grains grow to some extent in substantially the same manner as in the case where v/w is about 1.000. However, low-resistance $TiO_2$ was deposited at grain boundaries or the interfaces with the electrodes to reduce the resistance. Consequently, the resistance variation is reduced.

When x+y is less than about 0.001, the ceramic does not turn into semiconductor. Consequently, the resistance does not vary sufficiently or switch because a barrier is not formed at the interfaces with the electrodes or the resistance in the grains is too high. In contrast, when x+y is greater than about 0.02, the resistance is excessively reduced. Consequently, a Schottky barrier is not sufficiently formed at the interfaces with the electrodes and the resistance variation is reduced.

While Experiments 1 to 3 used La, Nd, Sm, Gd, Dy, Ho, or Y as a donor added to the Sr site. In addition to these elements, Ce, Pr, Eu, Tb, Er, Tm, Yb, or Lu may preferably be used to produce substantially the same effects.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A resistance memory element comprising:

an elementary body; and at least one pair of opposing electrodes separated by at least a portion of the elementary body; wherein when a switching voltage is applied between the at least one pair of electrodes in a first direction, a resistance of the portion of the elementary body disposed between the pair of electrodes is reduced and the elementary body maintains a low resistance state even after the switching voltage in the first direction is removed;

when a switching voltage is applied between the at least one pair of electrodes in a second direction opposite to the first direction, the resistance of the portion of the elementary body disposed between the pair of electrodes is increased and the elementary body maintains a high resistance state even after the switching voltage in the second direction is removed; and the elementary body is made of a strontium titanate-based semiconductor ceramic.

2. The resistance memory element according to claim 1, wherein the strontium titanate-based semiconductor ceramic is expressed by a formula: $(Sr_{1-x}A_x)_v(Ti_{1-y}B_y)_wO_3$, where A represents at least one element selected from the group consisting of Y and rare earth elements, and B represents at least one of Nb and Ta, and satisfies relationships $0.001 \leqq x+y \leqq 0.02$, where $0 \leqq x \leqq 0.02$ and $0 \leqq y \leqq 0.02$ and $0.87 \leqq v/w \leqq 1.030$.

3. The resistance memory element according to claim 2, wherein the strontium titanate-based semiconductor ceramic satisfies a relationship $0.005 \leqq x+y \leqq 0.01$.

4. The resistance memory element according to claim 2, wherein the strontium titanate-based semiconductor ceramic satisfies a relationship $0.95 \leqq v/w \leqq 1.010$.

5. The resistance memory element according to claim 1, wherein an average number of grain boundaries in the portion of the elementary body disposed between the pair of electrodes is in the range of about 0.5 to about 44.5.

6. The resistance memory element according to claim 1, wherein the at least one pair of electrodes are integrally fired with the together with the elementary body.

7. The resistance memory element according to claim 1, wherein the electrodes includes at least one metal selected from the group consisting of Pd, Pt, Ag—Pd, Au, Ru, and Ir.

* * * * *